United States Patent
Eka et al.

(10) Patent No.: US 6,357,036 B1
(45) Date of Patent: Mar. 12, 2002

(54) COMPUTERIZED METHOD AND APPARATUS FOR DESIGNING WIRE BOND DIAGRAMS AND LOCATING BOND PADS FOR A SEMICONDUCTOR DEVICE

(75) Inventors: Laiman Eka, Milpitas; Marcello R. Martinez, III, Santa Clara; Carl H. Fong, Cupertino, all of CA (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/301,691

(22) Filed: Apr. 29, 1999

Related U.S. Application Data
(60) Provisional application No. 60/102,970, filed on Oct. 2, 1998.

(51) Int. Cl.[7] ............................................. G06F 17/50
(52) U.S. Cl. ................................................... 716/15
(58) Field of Search ................................ 716/19, 4, 15

(56) References Cited

U.S. PATENT DOCUMENTS

| | | | |
|---|---|---|---|
| 4,864,514 A | * 9/1989 | Yamanaka | 716/19 |
| 5,155,065 A | 10/1992 | Schweiss | 716/8 |
| 5,465,217 A | 11/1995 | Yip et al. | 716/21 |
| 5,498,767 A | 3/1996 | Huddleston et al. | 716/12 |
| 5,608,638 A | 3/1997 | Tain et al. | 716/19 |
| 5,661,669 A | 8/1997 | Mozumder et al. | 716/19 |

* cited by examiner

*Primary Examiner*—Matthew Smith
*Assistant Examiner*—Thuan Do
(74) *Attorney, Agent, or Firm*—Robert P. Bell; Steven Lin

(57) ABSTRACT

The present invention provides a bond tool utility software package which extracts bond pad location data from a semiconductor chip design stored in one of a number of known formats (e.g., Opus, GDSII, or the like) and extracts conductor location data from an AUTOCAD file of a chip frame design. The utility retrieves bonding connection data from a design ASCII file and generates a bonding diagram for the semiconductor assembly. The utility also contains a subroutine for applying bonding design criteria to the resultant bonding diagram to determine whether all bonds are within established guidelines. If an impermissible bond is formed, the user may be alerted that one or more bonding pads may have to be relocated. In one embodiment of the present invention, the bonding utility may interface with a semiconductor design circuit to generate a suggested fix to an impermissible bonding situation. One or more bonding pads may be moved in the semiconductor design to correct for potential bonding deficiencies.

16 Claims, 2 Drawing Sheets

COMPUTERIZED METHOD AND APPARATUS FOR DESIGNING WIRE BOND DIAGRAMS AND LOCATING BOND PADS FOR A SEMICONDUCTOR DEVICE

CROSS REFERENCE TO RELATED APPLICATIONS

The present application claims priority from Provisional U.S. Patent Application Ser. No. 60/102,970, filed Oct. 2, 1998 and incorporated herein by reference.

FIELD OF THE INVENTION

The present invention relates to the field of computerized integrated circuit design, in particular a computerized method and apparatus for designing bond diagrams and locating bond pads for a semiconductor device.

BACKGROUND OF THE INVENTION

The design of integrated circuits is by and large a highly automated process. Complex and powerful software tools are available for converting a logic level design into a semiconductor circuit design ready to be etched and formed on a semiconductor substrate.

Such programs, such as those provided by Avant! Corporation of Fremont, Calif. and Cadence Design, of San Jose, Calif. automatically route conductors and locate components on a semiconductor chip using well established rules of design as well as huge libraries of pre-stored design modules. Once the design for a semiconductor circuit has been completed, the resultant design, in a standardized electronic format (e.g., Opus, GDSII, or the like) may be transmitted to a semiconductor fabrication facility or "fab" for fabrication.

However, fabrication represents only the circuit manufacturing portion of the semiconductor manufacturing process. Once circuits are formed on a semiconductor wafer, the wafer must then be broken into a number of discrete "chips" and mounted on a chip carrier with electrical leads wire-bonded from pads on the chip to conductors on the chip carrier.

Unlike the semiconductor design process, the process of designing the wire bonding layout has been largely manual. Engineers, using magnified copies of chip diagrams, resort to using rulers and pencils to draw in the locations of wire bonds. These drawn-in wire bond diagrams may then be used by an assembly facility to instruct a wire bonding machine as to which pad on a chip should be connected to which lead on the chip carrier. In some instances, not all pads may be bonded, and some leads may be bonded to more than one pad. Correct and accurate bonding information is essential to proper manufacturing of the completed circuit.

However, such hand-drawn circuit diagrams do not lend themselves well to automated processing. Moreover, pencilled-in diagrams may not photocopy properly, with the result that one or more bonds may be missed or incorrectly formed. In addition, with the ever increasing number of leads used in semiconductor devices (e.g., 128 or more), hand-drawing of such bonds maybe cumbersome and error prone.

When drawing such bonds on a bonding diagram, the Engineer also uses this opportunity to insure that the bonds comply with certain predetermined design criteria. For example, bonds which are too long may tend to sag when encapsulated, shorting out with adjacent bonds or the chip edge. Similarly, bonds may be required to be formed only within a certain angle from the chip or at a certain distance from adjacent bonds, to prevent mechanical or electrical interference.

Manually drawing and measuring such bonds may be a tedious and inaccurate process. Using a scaled-up drawing, the Engineer must be sure to make careful measurements with a rule to insure bonds are within design criteria.

In addition, if one or more bonds are not within design criteria, the Engineer must move a bonding pad in the chip design in order to correct the error. Such a move may require that the chip design be manually altered through manipulation of the semiconductor circuit design program.

Schweiss, U.S. Pat. No. 5,155,065, issued Oct. 13, 1993, discloses a method for configuring a plurality of pads on a semiconductor die to accommodate more than one pad pitch. Pad sizes and pad spacings are adjusted to achieve the pad configuration, which may form a pattern. This pattern may be repeated to meet the number of pads needed in the application. Schweiss is cited here as background only in that it teaches various techniques for determining correct pad spacing and pitch.

Tain et al., U.S. Pat. No. 5,608,638, issued Mar. 4, 1997, discloses a device and method for automation of a build sheet to manufacture a packaged integrated circuit. Tain et al. uses a GUI program to allow an engineer to generate buildsheet data automatically. This buildsheet data appears to include die size, wire bonding and die image. It appears that the "build sheet" is directed toward a wire bonding diagram.

However, Tain et al. does not make reference to making automated corrections to bond pad location nor package lead layouts for quality and yield optimization. Moreover, Tain et al., limited to a GUI application, makes no reference to operating system independence (i.e., Windows™ 95/98, NT or UNIX). In addition, Tain et al., makes no reference to techniques to keep file size at a minimum, transferability through gateways, networks, or FTP sites, or towards portability of a soft file to wire bond equipment to replace manual teaching techniques.

Huddleston et. al, U.S. Pat. No. 5,498,767, issued Mar. 12, 1996, discloses a method for positioning bond pads in a semiconductor die layout. Huddleston et al. teaches locating bond pads centers in account with both manufacturing and design limitations.

However, Huddleston et al. focuses only on determining wiring angle for silicon-to-package compatibility, and does not go beyond wire angle related issues. Thus, for Example, Huddleston et al. does not teach determining die size to die attach pad compatibility, minimum and maximum restrictions to wire length over silicon, over lead tip and overall bond length.

Yip, et al., U.S. Pat. No. 5,465,217, issued Nov. 7, 1995, also discloses an automated system for routing tape automated bonding (TAB) leads.

However, Yip et al. focusses on artwork for tape tab development based upon a desired pad pitch. The Yip et al. technique is thus restricted to tab based packages and does not encompass any semiconductor packaging and technologies for housing silicon (e.g., quad packages, dual-in-line packages, small outline packages, and the like).

Thus, it remains a requirement in the art to provide an automated process for designing bonding diagrams for semiconductor devices.

It remains a further requirement in the art to provide a technique for automatically determining whether a bonding layout complies with established bonding criteria.

It remains a further requirement in the art to provide a technique whereby a chip design may be automatically altered if one or more bonds do not meet established bonding criteria.

SUMMARY OF THE INVENTION

The present invention provides a bond tool utility software package which extracts bond pad location data from a semiconductor chip design stored in one of a number of known formats (e.g., Opus, GDSII, or the like) and extracts conductor location data from an AUTOCAD file of a chip frame design. The utility retrieves bonding connection data from a design ASCII file and generates a bonding diagram for the semiconductor assembly.

The utility also contains a subroutine for applying bonding design criteria to the resultant bonding diagram to determine whether all bonds are within established guidelines. If an impermissible bond is formed, the user may be alerted that one or more bonding pads may have to be relocated.

In one embodiment of the present invention, the bonding utility may interface with a semiconductor design circuit to generate a suggested fix to an impermissible bonding situation. One or more bonding pads may be moved in the semiconductor design to correct for potential bonding deficiencies.

BRIEF DESCRIPTIONS OF THE DRAWINGS

DETAILED DESCRIPTION OF THE INVENTION

Figure 1:
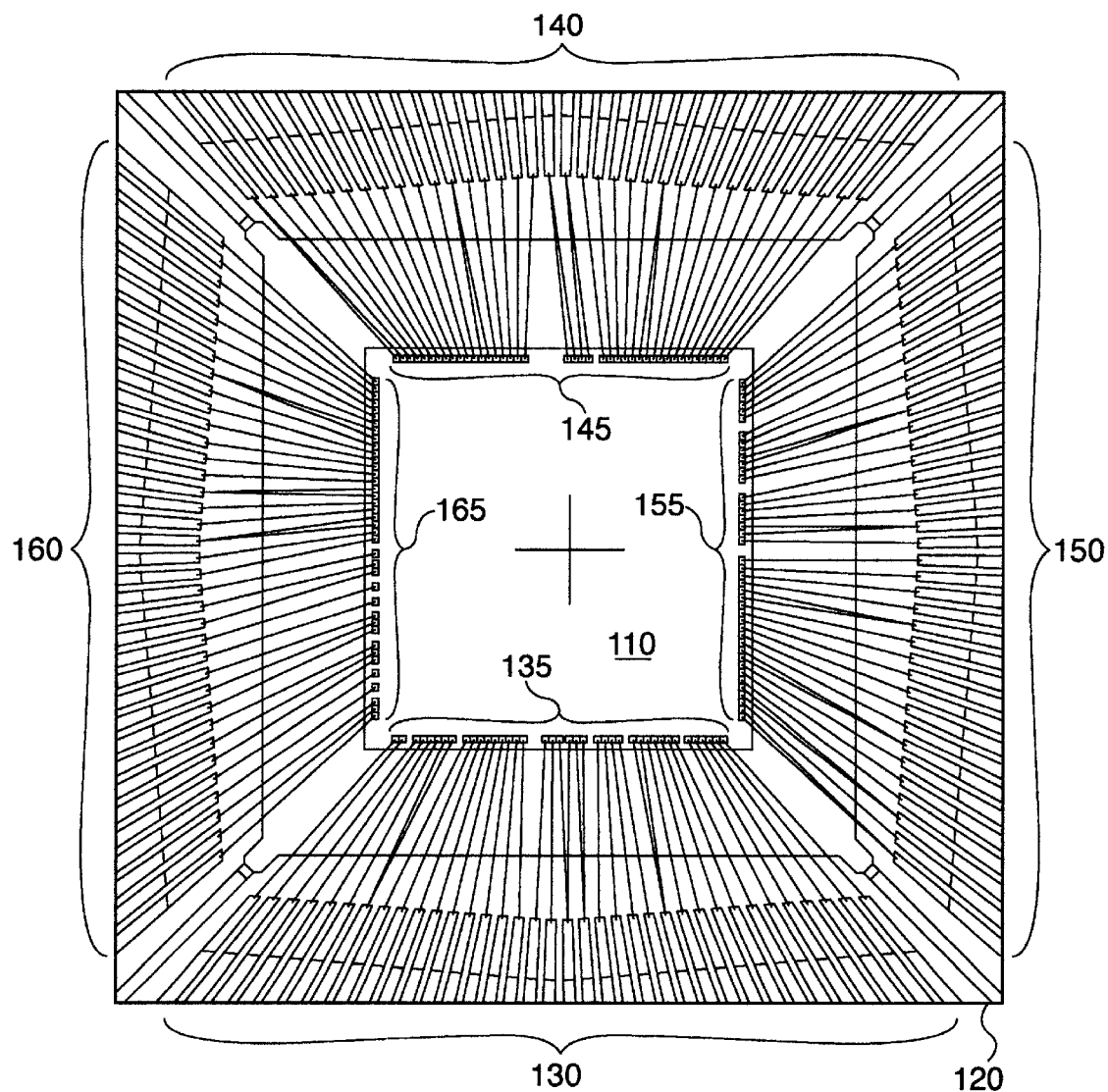
FIG. 1 is a top view of an enlarged wire bonding layout diagram.

FIG. 1 is a top view of an enlarged wire bonding layout diagram. The wire bonding diagram of FIG. 1 is an accurate scale drawing representing the connectivity of wire bonds between a semiconductor chip 110 and package die 120. Package die 120 may contain groups of leads 130, 140, 150, 160, which may be formed on one or more sides of the device. In the embodiment illustrated in FIG. 1, leads 130, 140, 150, and 160 are provided on all four sides of the device. Electrical leads 130, 140, 150, and 160 connect to external "pins" or contacts which connect the semiconductor device to a wire traces on a motherboard, circuit board, SIMM or the like.

When designing a semiconductor chip, generally the package type and general design constraints are known, and the package pinout selected in advance. Thus, generally wire bonds between pad groups 135, 145, 155, and 165 on semiconductor chip 110 will not cross one another. However, it may be difficult to determine a correct location of each of the pads within pad groups 135, 145, 155, and 165 in order to insure that wire bonds between pad groups 135, 145, 155, and 16 and corresponding leads 130, 140, 150, and 160 are formed correctly.

Noted that in some instances in FIG. 1, a single pad is bonded to two leads, or vice-versa. Note also that the pad spacing is non-uniform and moreover is much tighter than lead spacing. Thus, each lead approaches semiconductor chip 110 at a slightly different angle. Leads located at the corners of semiconductor chip 110 being at higher angles of incidence than leads neat a center portion of each side of semiconductor chip 110.

If pads are incorrectly located via-a-vis their corresponding lead, a wire bond may not be reliability formed or may interfere with an adjacent wire bond. For example, the angle of a wire bond with relationship to the corder of the pad should preferably be within a certain range to insure that a proper bond is formed.

Moreover, a pad should be located within a certain distance relationship between the edge of the chip over which the wire bond is formed. If the wire bond sags appreciably, it could contact the edge of the chip and corrupt the circuitry. Standard Design Rule Checks have been established in industry to insure that pad and bond locations are properly located.

In the prior art, these design rule checks may have been performed by hand, and the resultant bonding diagram (similar to the one illustrated in FIG. 1) would be drawn by hand. Such a technique is time consuming and tedious and moreover prone to inaccuracies. The resultant diagram may then be used to "teach" a wire bonding machine literally by tracing the diagram. The machine, once programmed, would then follow such a diagram to connect wire bonds between pads and leads.

Figure 2:
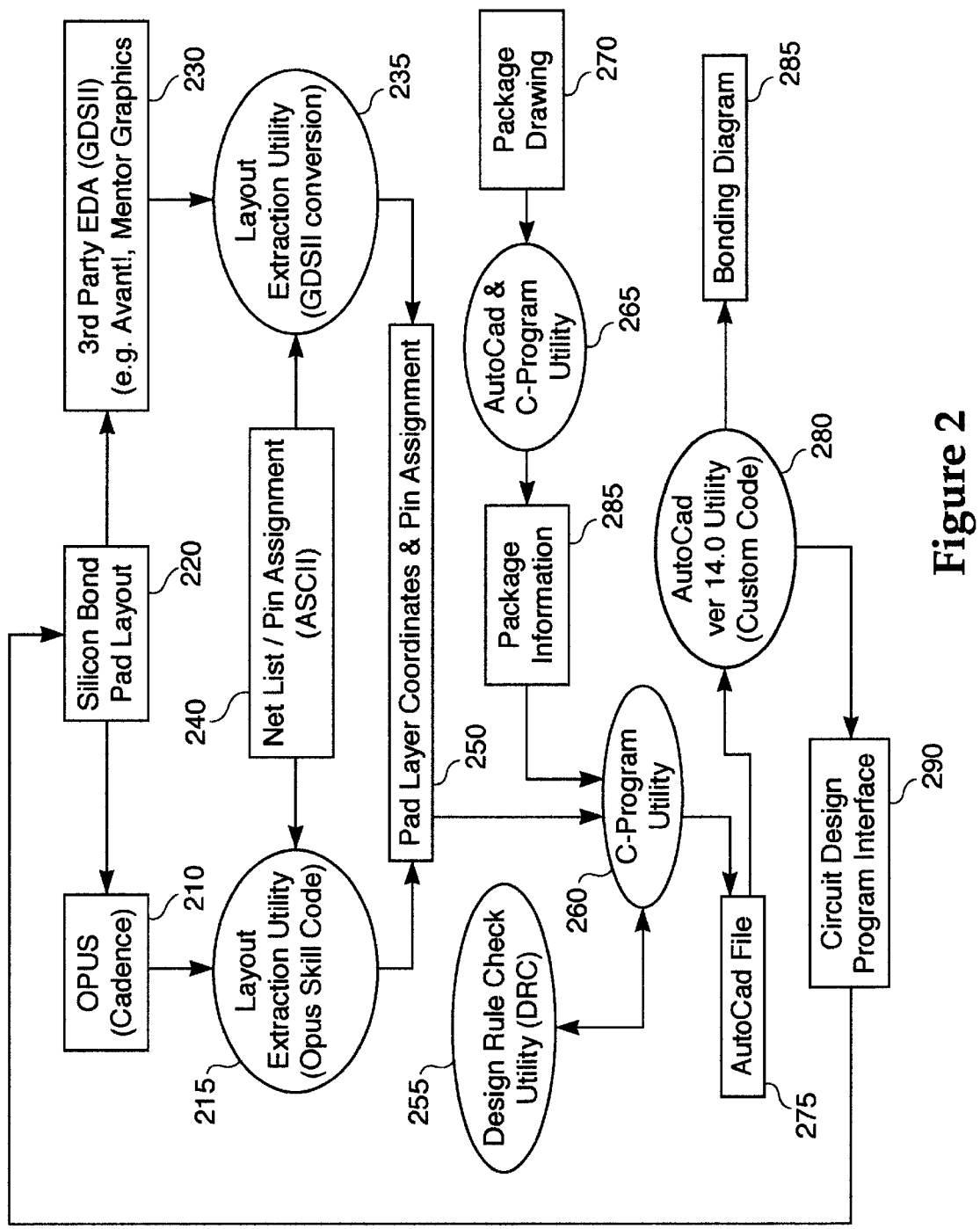
FIG. 2 is a block diagram illustrating the relationship between various software components and data elements in the present invention.

FIG. 2 is a block diagram illustrating the relationship between various software components and data elements in the present invention. Element 220 represents a data file comprising a silicon bond pad layout. Silicon bond pad layout 220 may represent the location of individual pads within a semiconductor device as determined after initial circuit design. While such pads may be properly located with regard to pinout order and the like, they may not be properly located with regard to wire bonding design constraints.

Silicon bond pad layout 220- may comprise a data file stored in one or more formats used with a corresponding circuit design program. A first format may comprise, for example, the OPUS format 210. Opus format 210 is a proprietary format of CADENCE corporation of San Jose, Calif. used with their proprietary circuit design software.

A second format may comprise, for example, the GDSII format 230. The GDSII format is an industry standard format used by a number of manufacturers such as Avant! corporation of Fremont, Calif. and Mentor Graphics, of San Jose Calif. IN addition, some proprietary software packages may have conversion or output routines which allow proprietary format data to be output in GDSII format 230.

Depending upon the format use, a layout extraction utility amy be used to extract pad layout design parameters from the overall circuit design. Since the detailed design of the circuitry (logic function, transistor size and location) are of little interest in wire bonding, only the pad location data is retrieved. OPUS layout extraction utility (OPUS Skill Code) 215 may be used to extract layout information from OPUS formatted data 210. Layout extraction utility 235 may be used to extract data from 3rd party data formats such as GDSII data 230.

Both layout extraction utilities 215 and 235 may also be fed with Net List/Pin Assignment data 240. Net List/Pin Assignment data 240 may comprise, for example, a list in ASCII format or other database format representing the connectivity between various pins on the semiconductor device and the corresponding bond pads. As illustrated in FIG. 1, some pins may connect to more than one bond pad and vice versa. Hence it may be necessary to include such data in order to determine the general bonding pattern.

From the extracted layout data and net list/pin assignment data, a database 250 may be created representing pay layer coordinates and pin assignments. Database 250 may include location data for each pad, as well as the pad assignment, its connectivity to particular pins, and those pin assignments. From such data, a wire bonding diagram may be generated.

Package drawing 270 may comprise a CAD drawing of the resultant end package design (e.g., quad flat pack or the like). Package drawing 270 data may be fed to autocad program 265 which may be modified by a C-program utility to generate package information 285. Package information 285 may comprise that portion of package drawing 270 which illustrates the location of leads 130, 140, 150, and 160.

Package information 285 and database 250 may then be fed to C-program utility 260. C-program utility 260 receives pad layer coordinates and pin assignment from database 250 and package information data 285 and feed all data through design rule check utility 255. Design rule check utility 255 may comprise a C-program which will check angles and distances of leads from the package leads to silicon pads and determine whether a rule violation has occurred.

If a bonding rule violation has occurred, C-program utility 260 may do one of two things. First, a user may be alerted of the violation and allowed the opportunity to correct the violation manually. The user may then utilize AUTOCAD drafting software to move a silicon pad to correct the design rule violation. The revised AUTOCAD file may then be fed back through C-program utility and design rule check utility to determine whether the revised design contains and bonding rule errors.

In a second technique, C-program utility may be programmed to automatically correct for bonding rule errors by relocating pads on the silicon design. In either instance, once the bonding diagram meets all design rule criteria, an AUTOCAD file 275 may be produced comprising the revised bonding diagram. AUTOCAD file 275 may be fed to AUTOCAD utility 280, which may comprise custom code, to output a bonding diagram 285.

AutoCad utility 280 may also output corrected pad location data to circuit design program interface 290. Circuit design program interface 290 may comprise a C-program utility patch to one of a number of circuit design programs offered by a number of providers (e.g., Cadence, Avant!, or the like). Circuit design program interface 290 may alter the data file for the circuit design to correct the silicon bond pay layout in view of any design rule violations previously detected.

While the preferred embodiment and various alternative embodiments of the invention have been disclosed and described in detail herein, it may be apparent to those skilled in the art that various changes in form and detail may be made therein without departing from the spirit and scope thereof.

What is claimed is:

1. A computerized automatic method for generating a wire bonding diagram for a semiconductor device, said method comprising the steps of:

generating, in a computer, pad layer coordinates and pin assignments from semiconductor design data;

generating, in a computer, package information from semiconductor package drawing information;

generating, in a computer, wire bonding diagram data from the extracted package information and the pad layer coordinates and pin assignments;

automatically checking, with a computer program, the wire bonding diagram data against a design rule database comprising a predetermined set of wire bonding rules to determine whether any wire bonds violate one or more of the predetermined set wire bonding rules;

automatically adjusting location of one or more pads in the semiconductor design in response to any violation of the predetermined set of wire bonding rules; and automatically generating a bonding diagram database representing locations of wire bonds for the semiconductor device.

2. The method of claim 1, wherein said step of generating pad layer coordinates and pin assignments from semiconductor design data comprises the steps of:

receiving, from a circuit design computer program, a circuit design database representing a circuit design of the semiconductor device;

receiving a pin assignment database representing pin assignments for the semiconductor device; and extracting, using a computer program, pad layer coordinates and pin assignments from the from the circuit design database and the pin assignment database.

3. The method of claim 2, wherein said step of generating package information from semiconductor package drawing information comprises the steps of:

receiving a drawing database comprising a drawing of a package design for the semiconductor device; and extracting, using a computer program, package information from the drawing database.

4. The method of claim 2, further comprising the steps of:

outputting adjusted locations of one or more pads in the circuit design adjusted in response to any violation of the predetermined set of wire bonding rules to an interface program;

converting the adjusted locations of the one or more pads into a data format compatible with the circuit design computer program; and revising the first database to reflect the adjusted locations of the one or more pads.

5. A series of steps to be performed by a computer for generating a bonding diagram for a semiconductor device, comprising the steps of:

generating, from semiconductor design data, a first data file comprising pad layer coordinates of the semiconductor device and pin assignments for a semiconductor package;

generating, from semiconductor package drawing data, a second data file comprising package lead location data;

generating, from the first and second data files, a third data file comprising wire bonding diagram data;

checking the wire bonding diagram data against a design rule database comprising a predetermined set of wire bonding rules to determine whether any wire bonds violate one or more of the predetermined set wire bonding rules;

adjusting location of one or more pads in the wire bonding diagram data in the third data file in response to any violation of the predetermined set of wire bonding rules; and outputting the wire bonding diagram data in the third data file representing locations of wire bonds for the semiconductor device.

6. The series of steps to be performed by a computer for generating a bonding diagram for a semiconductor device of claim 5, wherein said step of generating the first data file comprises the steps of:

receiving, from a circuit design computer program, a circuit design database representing a circuit design of the semiconductor device;

receiving a pin assignment database representing pin assignments for the semiconductor device; and extracting pad layer coordinates and pin assignments from the from the circuit design database and the pin assignment database.

7. The series of steps to be performed by a computer for generating a bonding diagram for a semiconductor device of claim 6, wherein said step of generating the second data file comprises the steps of:

receiving a drawing database comprising a drawing of a package design for the semiconductor device; and extracting package information from the drawing database.

8. The series of steps to be performed by a computer for generating a bonding diagram for a semiconductor device of claim 6, further comprising the steps of:

outputting adjusted locations of one or more pads in the circuit design adjusted in response to any violation of the predetermined set of wire bonding rules to an interface program;

converting the adjusted locations of the one or more pads into a data format compatible with the circuit design computer program; and revising the first database to reflect the adjusted locations of the one or more pads.

9. An apparatus for generating a wire bonding diagram for a semiconductor device, comprising:

first means for generating pad layer coordinates and pin assignments from semiconductor design data;

second means for generating package information from semiconductor package drawing information;

third means, coupled to said first and second means, for generating wire bonding diagram data from the extracted package information and the pad layer coordinates and pin assignments;

fourth means for checking the wire bonding diagram data against a design rule database comprising a predetermined set of wire bonding rules to determine whether any wire bonds violate one or more of the predetermined set wire bonding rules;

fifth means for adjusting location of one or more pads in the semiconductor design in response to any violation of the predetermined set of wire bonding rules; and sixth means for generating a bonding diagram database representing locations of wire bonds for the semiconductor device.

10. The apparatus of claim 9, wherein said first means for generating pad layer coordinates and pin assignments from semiconductor design data comprises:

means for receiving, from a circuit design computer program, a circuit design database representing a circuit design of the semiconductor device;

means for receiving a pin assignment database representing pin assignments for the semiconductor device; and a computer program for extracting pad layer coordinates and pin assignments from the from the circuit design database and the pin assignment database.

11. The apparatus of claim 9, wherein said second means for generating package information from semiconductor package drawing information comprises:

means for receiving a drawing database comprising a drawing of a package design for the semiconductor device; and a computer program for extracting package information from the drawing database.

12. The apparatus of claim 9, further comprising:

means for outputting adjusted locations of one or more pads in the circuit design adjusted in response to any violation of the predetermined set of wire bonding rules to an interface program;

means for converting the adjusted locations of the one or more pads into a data format compatible with the circuit design computer program; and means for revising the first database to reflect the adjusted locations of the one or more pads.

13. A computer program for use with semiconductor circuit design program data and computer generated design drafting data of a semiconductor package, the computer program comprising:

a first portion, receiving the semiconductor circuit design program data and a net list pin assignment data file, for extracting pad layer coordinates and pin assignments;

a second portion, receiving the design drafting data of a semiconductor package, for generating package lead location information;

a third portion, receiving the extracted pay layer coordinates and pin assignments and package lead location information and generating wire bonding diagram data;

a fourth portion, receiving the wire bonding diagram data and checking the wire bonding diagram data against a design rule database comprising a predetermined set of wire bonding rules to determine whether any wire bonds violate one or more of the predetermined set wire bonding rules; and a fifth portion, for adjusting location of one or more pads layer coordinates in response to any violation of the predetermined set of wire bonding rules.

14. The computer program of claim 13, wherein said first portion comprises:

means for receiving, from a semiconductor circuit design computer program, the semiconductor circuit design program data representing a circuit design of the semiconductor device;

means for receiving a pin assignment database representing pin assignments for the semiconductor device; and means for extracting pad layer coordinates and pin assignments from the from the semiconductor circuit design program data and the pin assignment database.

15. The computer program of claim 14, wherein said second portion comprises:

means for receiving a drawing database comprising a drawing of a package design for the semiconductor device; and means for extracting package lead location information from the drawing database.

16. The computer program of claim 13, further comprising:

a sixth portion for outputting adjusted locations of one or more pad layer coordinates in the circuit design adjusted in response to any violation of the predetermined set of wire bonding rules to an interface program;

a seventh portion for converting the adjusted locations of the one or more pad layer coordinates into a data format compatible with the semiconductor circuit design computer program data; and means for revising the semiconductor circuit design program data reflect adjusted locations of the one or more pad layer coordinates.

* * * * *